United States Patent [19]
Duke et al.

[11] 4,088,490
[45] May 9, 1978

[54] SINGLE LEVEL MASKING PROCESS WITH TWO POSITIVE PHOTORESIST LAYERS

[75] Inventors: Peter James Duke, San Jose; Jerry Leff, Saratoga; Leo Calica Liclican; Mark Vernon Powell, both of San Jose, all of Calif.

[73] Assignee: International Business Machines Corporation, Armonk, N.Y.

[21] Appl. No.: 695,484

[22] Filed: Jun. 14, 1976

[51] Int. Cl.² .............................................. G03C 5/00
[52] U.S. Cl. ......................................... 96/36.2; 96/36; 156/651; 156/661; 204/15; 204/23; 427/43; 427/89; 427/123; 427/259; 427/265; 427/304; 427/328
[58] Field of Search ...................... 96/36, 36.2, 38.4; 156/11, 651, 661; 427/43, 259, 265, 304, 328, 89, 123; 204/15, 23

[56] References Cited

U.S. PATENT DOCUMENTS

| | | | |
|---|---|---|---|
| 3,506,441 | 4/1970 | Gottfried | 96/36.2 |
| 3,745,094 | 7/1973 | Greene | 204/15 |
| 3,955,981 | 5/1976 | Stachniak | 96/36 X |
| 3,957,552 | 5/1976 | Ann et al. | 156/11 |

Primary Examiner—Edward C. Kimlin
Attorney, Agent, or Firm—Joseph E. Kieninger

[57] ABSTRACT

This single level masking process includes the use of two layers of a positive photoresist. A pattern is formed in the first layer of photoresist. This photoresist pattern is heated and polymerized to a degree which permits it to be resistant to attack when covered with a second layer of the same positive photoresist, that is, the first photoresist pattern will maintain its integrity. After the heat treatment, the first layer pattern is substantially insensitive to actinic radiation and is easily stripped with conventional solvents. A pattern is formed in a second layer of photoresist that is different from the pattern formed in the first layer. After a first metal is deposited on portions of the substrates exposed in the second layer pattern, the second layer pattern is removed. A second metal is deposited on the portions of the substrate exposed in the first layer pattern and then that pattern is removed.

7 Claims, 9 Drawing Figures

U.S.Patent  May 9, 1978  4,088,490

SINGLE LEVEL MASKING PROCESS WITH TWO POSITIVE PHOTORESIST LAYERS

FIELD OF THE INVENTION

This invention relates to fabrication of microelectronic devices, and more particularly the fabrication of magnetic bubble domain chips having multiple metallic films thereon which are provided by a process having only a single critical masking step.

DESCRIPTION OF THE PRIOR ART

In the fabrication of microelectronic devices, such as semiconductor devices and bubble domain devices, it is frequently necessary to form multiple layers of material which must be in accurate alignment with one another. For instance, in the fabrication of magnetic bubble domain devices, it is often necessary that the conductor layers be precisely aligned with propagation layers used to move magnetic bubble domains in the magnetic material. This is described fully in the IBM Technical Disclosure Bulletin article, appearing in Vol. 15, No. 6, November 1972, at page 1826. In that article, a plurality of masking steps and alignments are used to provide the final device structure.

In the bubble domain art, attempts have been made to provide improved fabrication processes which will not require extensive use of high resolution masks and which will not require multiple masking steps where critical alignments must be maintained. For instance, A. H. Bobeck et al describes such a process in IEEE Transactions on Magnetics, Volume MAG-9, No. 3, September 1973, at page 474. In the process of Bobeck et al., single level metallurgy for producing bubble domain devices is described. In particular, a shadow mask is used to protect the sensor area of the bubble domain chip during deposition of the conductor layers which are used for various device functions and for providing current to the sensor.

In a copending patent application, Ser. No. 555,645 filed Mar. 5, 1975, now U.S. Pat. No. 3,957,552, and assigned to the assignee of this application, describes a method for making multilayer devices using only a single critical masking step. A two metal layer −1 pattern structure is formed with the use of a positive photoresist layer and a negative photoresist layer. The patent to Horst, U.S. Pat. No. 3,873,313 describes a process for forming a resist pattern using a positive photoresist layer and a negative photoresist layer to form a two metal layer −1 or 2 pattern structure.

The use of a double coating of a positive photoresist is described in an IBM Technical Disclosure Bulletin, Vol. 10, No. 12, May 1968 at p. 1865. In that article the double coating of the positive photoresist was used to form a single pattern which was pinhole free. This method is suitable for a two metal layer −1 pattern structure.

In the single level metallurgy process the resolution required exceeds that normally obtained in conventional photolithography. As a result expensive equipment and materials such as E-beam, X-ray and deep UV exposure units and polymethylmethacrylate photoresist which are not suitable for widespread use are required.

SUMMARY OF THE INVENTION

It is a primary object of this invention to provide a new method for selectively metallizing a microelectronic device.

It is another object of this invention to provide a method for metallizing having high resolution.

It is still another object of this invention to provide a photolithography method having a high degree of resolution.

These and other objects are accomplished by a method that utilizes two layers of a positive photoresist. The first layer of photoresist is exposed to actinic radiation through a first mask. After developing, the exposed portion of the first layer is removed to form a first pattern remaining in the photoresist layer. This pattern is baked at a temperature, for example, 105° C, for a time period, for example, 16 hours, in order to sufficiently insolubilize the first pattern in positive photoresist and to cause the first pattern to be substantially insensitive to further exposure of actinic radiation. A second layer of a positive photoresist is applied on top of the first pattern. The second layer of photoresist is exposed to actinic radiation through a second mask which is different from the first mask. The second layer is developed and the exposed portions of the second layer are removed to form a second pattern. A first metal is then deposited on the substrate in those exposed areas common to the first and second layer patterns. A suitable metal for this first layer is gold. The second pattern is removed by exposing to actinic radiation and dissolving with developer without affecting the integrity of the first pattern. A second metal is deposited on the portions of the substrate exposed in the first pattern. The first pattern is then removed.

Other objects of this invention will be apparent from the detailed description reference being made to the accompanying drawings.

DETAILED DESCRIPTION OF THE INVENTION

This metallization process involves the use of two layers of a positive photoresist in which the first layer of photoresist is subjected to a treatment which permits it to retain its integrity during the processing of the second layer of photoresist.

Figure 1:
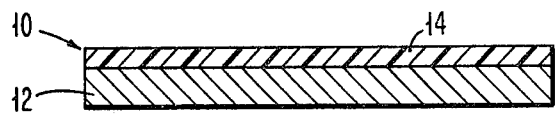
FIGS. 1 through 9 are cross sectional views of the microelectronic device structure illustrating the various stages in the process of this invention.

As shown in FIG. 1 a microelectronic device 10 has a substrate 12. The substrate 12 in a bubble domain device consists of, typically, a layer of gadolinium gallium garnet having an LPE (liquid phase epitaxial) film thereon of a material suitable for supporting bubble domains therein. Examples of LPE films for bubble use are $Y_{1.95}Sm_{.09}Lu_{.09}Ca_{.87}Ge_{.87}Fe_{4.13}O_{12}$ and $Y_{1.8}Sm_{.1}Tm_{.2}Ca_{.9}Ge_{.9}Fe_{4.1}O_{12}$. It is understood, of course, that in semiconductors that the substrate would be silicon or silicon dioxide or other suitable material.

On top of the substrate 12 is a layer of positive photoresist 14. A positive photoresist becomes more soluble upon exposure to actinic radiation. Positioned between the photoresist layer 14 and the substrate 12 is a layer of metal (not shown) for plating such as Permalloy metal which is about 225 angstroms thick. This conductive layer is generally positioned on top of a spacer layer (not shown) which is on top of the substrate 12. The positive photoresist 14 may be any of the positive photoresist well known in the art. An example is AZ-1350J, a positive photoresist sold by Shipley which contains n-cresol formaldehyde novolak resin, napthoquinone diazide, cellosolve acetate, butyl acetate and xylene.

As is the practice in the art, the layer of positive photoresist 14 is subjected to a prebake step to remove excess solvent. Typically, the prebake step is done at a temperature of the order of 85° C for a time period of about 20-45 minutes.

Figure 2:
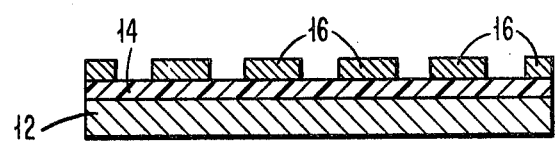

As shown in FIG. 2 a mask 16 is placed on top of photoresist layer 14. The mask 16 is a high resolution mask and no alignment is required. Portions of the photoresist layer 14 are exposed to actinic radiation.

Figure 3:
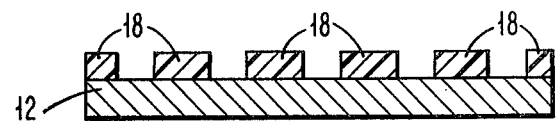

After the exposure to actinic radiation the positive photoresist layer 14 is developed. The photoresist portions that have been exposed to actinic radiation are dissolved in a solution of a conventional developer to form a first layer pattern 18 as shown in FIG. 3.

In accordance with this invention the pattern 18 is subjected to a heat treatment in order to sufficiently insolubilize pattern 18 in the original positive photoresist material as well as to cause pattern 18 to be substantially insensitive to any subsequent exposure to actinic radiation. With respect to the solubility characteristics, it is necessary that the first pattern be sufficiently insoluble in the photoresist so that the pattern does not dissolve in the photoresist and thereby lose its integrity and its resolution. On the other hand the pattern must not be too insoluble since it must be removed by typical solvents. If the pattern is too insoluble and not soluble in typical photoresist solvents, it would be necessary to use acids which etch away the photoresist. The use of acid etches is to be avoided since acid etches are deleterious to the metallization. Since pattern 18 is a positive photoresist material, it is necessary to desensitize this material so that the portions of pattern 18 that are exposed to actinic radiation in forming a second pattern will not become more soluble.

It has been determined that a heat treatment involving the baking of pattern 18 at a temperature of higher than 95° C and less than 120° C will satisfy the requirements set forth above. The preferred temperature is of the order of 105° C. Typically, the baking step requires a time of 6 hours or more, preferably of the order of 16 to 18 hours. Longer times may be used if more convenient. Temperatures below 105° C, that is between 100° C and 105° C may require a somewhat longer time than the 6 hours. Temperatures above 105° C, that is from 105° C to 120° C may require less time than 6 hours. At temperatures between 110° C and 120° C the photoresist material starts to reflow. As a result, heat treatment at temperatures in this range should not be continued for a time period in which reflow occurs. In otherwords the heat treatment at elevated temperatures is for a time preferably less than that required to produce reflow.

Figure 4:
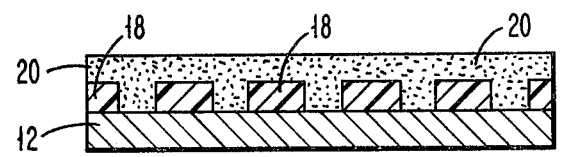

As shown in FIG. 4 the pattern 18 is covered with a layer of positive photoresist layer 20. The positive photoresist in layer 20 is similar to the positive photoresist in layer 14 described above.

Figure 5:
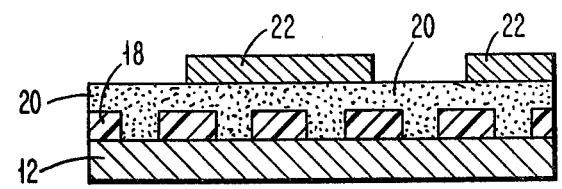

A mask 22 is positioned on top of photoresist layer 20 as shown in FIG. 5. The photoresist layer 20 is then exposed to actinic radiation through the openings through the mask 22. The mask 22 used on the photoresist layer 20 is different than the mask 16 used on the photoresist layer 14. Because of this mask difference, there are areas or portions of pattern 18 which are exposed to actinic radiation in the same fashion as the photoresist layer 20. During this exposure step the portions of layer 20 not covered by mask 22 is made more soluble, as is the practice with positive photoresist.

However, the portions of the pattern 18 that are exposed to the same actinic radiation are not made more soluble because they have been previously made insensitive to the actinic radiation by the heat treatment.

Figure 6:
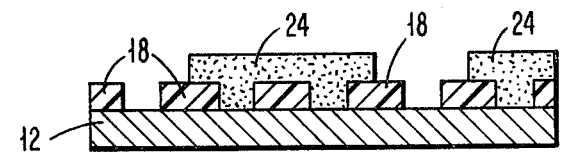
Figure 7:
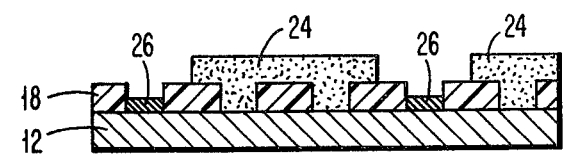

The exposed portions of layer 20 are dissolved in developer and removed to leave pattern 24 in the second layer as shown in FIG. 6. A metal is then plated through the openings in pattern 24 which extends through the openings in pattern 18 to the substrate 12 as shown in FIG. 7. The plating is made possible by the thin film of Permalloy metal or other metal not shown in the figure but described in the description on FIG. 1. While any metal may be deposited, gold is an example of a metal commonly used for bubble domain devices. The metal 26 is deposited in the openings previously mentioned.

Figure 8:
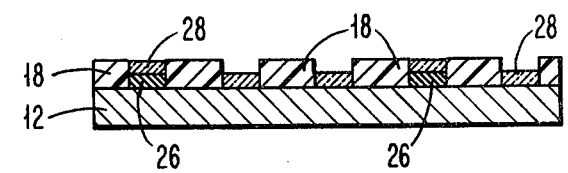

As shown in FIG. 8 the pattern 24 is then removed by exposing to actinic radiation and dissolving in developer. The pattern 18 is unaffected since it has previously been made insensitive to actinic radiation by heat treatment and is substantially insoluble in the developer used on the pattern 24. A metal 28, such as Permalloy metal, is then deposited on substrate 12 in all openings of the pattern 18. The metal 28 is also deposited on top of the metal layers 26 to form a double metal layer in those places. The double metal layers 26 and 28 are useful for particular functions in bubble domain devices. It is understood, of course, that other metals other than the Permalloy type may be deposited in this metallizing step as well as the previous metallizing step.

Figure 9:

As shown in FIG. 9 the pattern 18 is removed by the use of a suitable solvent, for example, Acetone. The Permalloy or metal layer that was described in FIG. 1 (although not shown) is then removed by sputter etching to form the structure as shown in FIG. 9.

EXAMPLE NO. 1

A first layer of AZ-1350J positive photoresist 1.2 micron thick was spun onto a garnet substrate and subjected to a prebake treatment at 85° C for 45 minutes to remove excess solvent. The first layer of photoresist was subjected to actinic radiation for 5 seconds through a high resolution first mask. The soluble photoresist was removed with an AZ developer and the resulting first pattern dried in nitrogen. The first pattern was then baked for 18 hours at a temperature of 105° C. The pattern maintained its integrity during this heat treatment and no reflow of the photoresist was observed. A second layer of AZ-1350J photoresist 1.2 micron thick was spun onto the top of the first pattern. The second layer was subjected to a prebake treatment of 85° C for 20 minutes. The first pattern was not dissolved by the second layer of photoresist. The second layer of photoresist was exposed for 10 seconds to actinic radiation through a second mask which was different from the first mask. The soluble photoresist in the second layer was removed with an AZ developer to form a second pattern. Gold was then plated on the portions of the substrate common to the first and second patterns. The surface was then blanket exposed to actinic radiation for 10 seconds. The second pattern was then developed and removed. The first pattern retained its integrity and had not been affected by the second layer processing. Permalloy metal was then plated onto the areas exposed by the first pattern. The first pattern was then stripped with a solvent, acetone.

EXAMPLES 2-14

The same procedure as Example 1 was used on Examples 2-14. The results are tabulated in the following table.

| Example | Substrate | Temp. 0° C | Time Hours | Resist Flow | First Pattern Dissolved by 2nd layer | First Pattern Affected by 2nd layer processing |
|---|---|---|---|---|---|---|
| 2 | glass | 90 | 48 | No | Yes | — |
| 3 | glass | 95 | 18 | No | Yes | — |
| 4 | glass | 100 | 48 | No | No | No |
| 5 | garnet | 100 | 24 | No | No | No |
| 6 | glass | 100 | 18 | No | No | slightly |
| 7 | glass | 100 | 18 | No | No | No |
| 8 | glass | 105 | 48 | No | No | No |
| 9 | glass | 105 | 24 | No | No | No |
| 1 | garnet | 105 | 18 | No | No | No |
| 10 | glass | 105 | 6 | No | No | No |
| 11 | glass | 110 | 18 | No | No | No |
| 12 | glass | 115 | 18 | very slight | No | No |
| 13 | glass | 120 | ½ | slight | Yes | — |
| 14 | glass | 130 | ½ | Yes | — | — |

Examples 2 and 3 show that at temperatures of 90° and 95° C the first pattern is dissolved by the second layer of photoresist. Examples 4-7 show that a temperature of 100° C a time of 18 hours or longer is necessary.

Examples 1, 8, 9 and 10 show that at a temperature of 105° C the time can be as short as 6 hours or as long as 48 hours. In Example 12 at a temperature of 115° C for 18 hours there was an indication of very slight reflow of the photoresist. The time should not exceed 18 hours at 115° C. In Examples 13 and 14 at temperatures of 120° C and 130° C for 30 minutes there were problems with either resist reflow or dissolving in the second layer of photoresist.

Although a preferred embodiment of this invention has been described, it is understood that numerous variations may be made in accordance with the principles of this invention.

We claim:

1. A method for selectively metallizing a microelectronic device comprising the steps of applying a first layer of a certain positive photoresist upon a conductivity clad substrate, said photoresist becoming more soluble upon exposure to actinic radiation, exposing said first layer to actinic radiation through a first mask, developing to remove the exposed portion of said first layer whereby a first pattern with critical dimensions is formed in said first layer, baking said first pattern sufficiently to partially insolubilize said first pattern in said photoresist to cause said first pattern to be substantially insensitive to actinic radiation but later removable by a solvent, applying a second layer of said certain photoresist to cover said first pattern and said substrate, exposing said second layer and said first pattern to actinic radiation through a second mask, said second mask different from said first mask, developing to remove the exposed portion of said second layer whereby a second pattern in said second layer is formed without affecting the dimensions of said first pattern, depositing a first metal on the portions of said substrate exposed by both said first pattern and said second pattern, exposing said second pattern to actinic radiation and then developing it for removing said second pattern without affecting said first pattern, depositing a second metal on the portions of said substrate exposed in said first pattern, and stripping said first pattern with said solvent.

2. A method as described in claim 1 including a bake step of said first layer and said second layer to remove excess solvent prior to exposure to actinic radiation.

3. A method as described in claim 1 whereby the baking step of said first pattern is at a temperature higher than 95° C and less than 120° C.

4. A method as described in claim 3 whereby the baking step is at a temperature ranging between 100° C and 110° C.

5. A method as described in claim 4 whereby the baking step is at a temperature about 105° C.

6. A method as described in claim 5 whereby the baking step is for a period of time exceeding 6 hours.

7. A method described in claim 6 whereby the baking step is for a period of 15 to 20 hours.

* * * * *